April 6, 1965 V. D. ELARDE 3,176,381

METHOD OF FORMING WELDABLE TERMINALS ON CIRCUIT BOARDS

Original Filed Sept. 19, 1960

INVENTOR.
Vito D. Elarde
BY
L. F. Hammand.
Atty.

3,176,381

METHOD OF FORMING WELDABLE TERMINALS ON CIRCUIT BOARDS

Vito D. Elarde, Downers Grove, Ill., assignor to Amphenol-Borg Electronics Corporation, Broadview, Ill., a corporation of Delaware Original application Sept. 19, 1960, Ser. No. 56,974, now Patent No. 3,129,280. Divided and this application Jan. 22, 1962, Ser. No. 167,810
2 Claims. (Cl. 29—155.5)

This application is a division of Serial No. 56,974, filed September 19, 1960, and now Patent No. 3,129,280.

The present invention relates to electronic circuit boards and particularly to circuit boards of quite universal applicability, suited for use in any conventional electronic circuitry, yet capable of satisfactory performance under extreme environmental conditions, including elevated temperatures, impact and vibration.

It is thus a primary object of the invention to provide printed circuit boards of unique structure capable of successfully meeting the exacting requirements encountered in the construction of various different types of electronic equipment by the simultaneous provision of:

(1) High conductivity connecting conductors;

(2) Terminals well suited to welding as well as soldering, and characterized by (3) Flexibility of interconnecting conductors.

This involves reconciliation of several heretofore conflicting considerations since, according to conventonal prior art practice, circuit boards have not ordinarily been compatible with welding of circuit junctions; the harder metals, better suited to welding, have often been too brittle to afford the degree of conductor flexibility needed to avoid disastrous circuit failures, while circuitry suited to welding has usually required hand wiring.

It follows that one object of the invention is to provide a circuit board designed to facilitate interconnection of the wiring of the circuit boards to the leads of electronic components by any desired method, as by conventional soldering, solder dipping, resistance heated soldering, or by welding.

A further object of the invention is to provide circuit boards having the features noted above, yet wherein the internal conductors of the boards consist of quite flexible ribbons of highly ductile metal, unlikely to be damaged by bending and having an unusually high degree of electrical conductivity.

A further object is to provide circuit boards having all of the features mentioned above wherein the individual conductors of the boards, although consisting of a single integrated piece of metal, include terminal tabs formed of harder or tougher metal capable of forming higher quality welds than possible with any of the more ductile metals; the boards being formed, however, in a manner such that any bending of the conductors (either in the course of manufacture or during the assembly of components thereon), takes place in the ductile areas of the conductors with no appreciable bending of the terminal tabs.

The foregoing objects are accomplished in the present invention by the provision of circuit boards wherein a plurality of separate, independent internal pattern conductors are carried by a sheet of dielectric material, with the individual conductors consisting of flexible ribbons of comparatively soft, ductile, high conductivity metals such as copper or silver embedded in the dielectric sheet, but with the conductive ribbons including portions bent outwardly and carrying integrated terminal tabs of harder metal such as nickel, for example, which is more adaptable to welding.

In practice, the present invention thus provides for a circuit wherein, although the several components involved are interconnected by high conductivity strips such as copper, silver, or the like, yet the junctions between the conductors and the components may be welded joints formed between metals such as nickel or similar metals of more tough, durable characteristics whereby the circuitry may be almost impervious to physical shock, impact or vibration and unaffected by temperatures which would destroy equipment employing conventional printed circuits or soldered connections.

According to the preferred practice of the invention, the circuit board conductors have terminals consisting of upstanding brackets from which the welding tabs may project laterally outwardly. It follows that the terminal tabs are not only in a position easily reached for soldering, but are also conveniently accessible for completion of welded joints by the application of the paired electrodes of a spot welding machine, for example.

It will be obvious that a further object of the present invention is the provision of the unique method of manufacture disclosed hereinafter, such that the boards may be manufactured conveniently and economically by conventional electroplating processes, yet will be capable of achieving the advantages indicated above. The manner in which these objects are achieved is most easily explained in connection with the drawings attached to and forming a part of the present specification, wherein.

Figures 1, 2, 3, 4, 5, 6, 7, 8, 9, 10, 11:
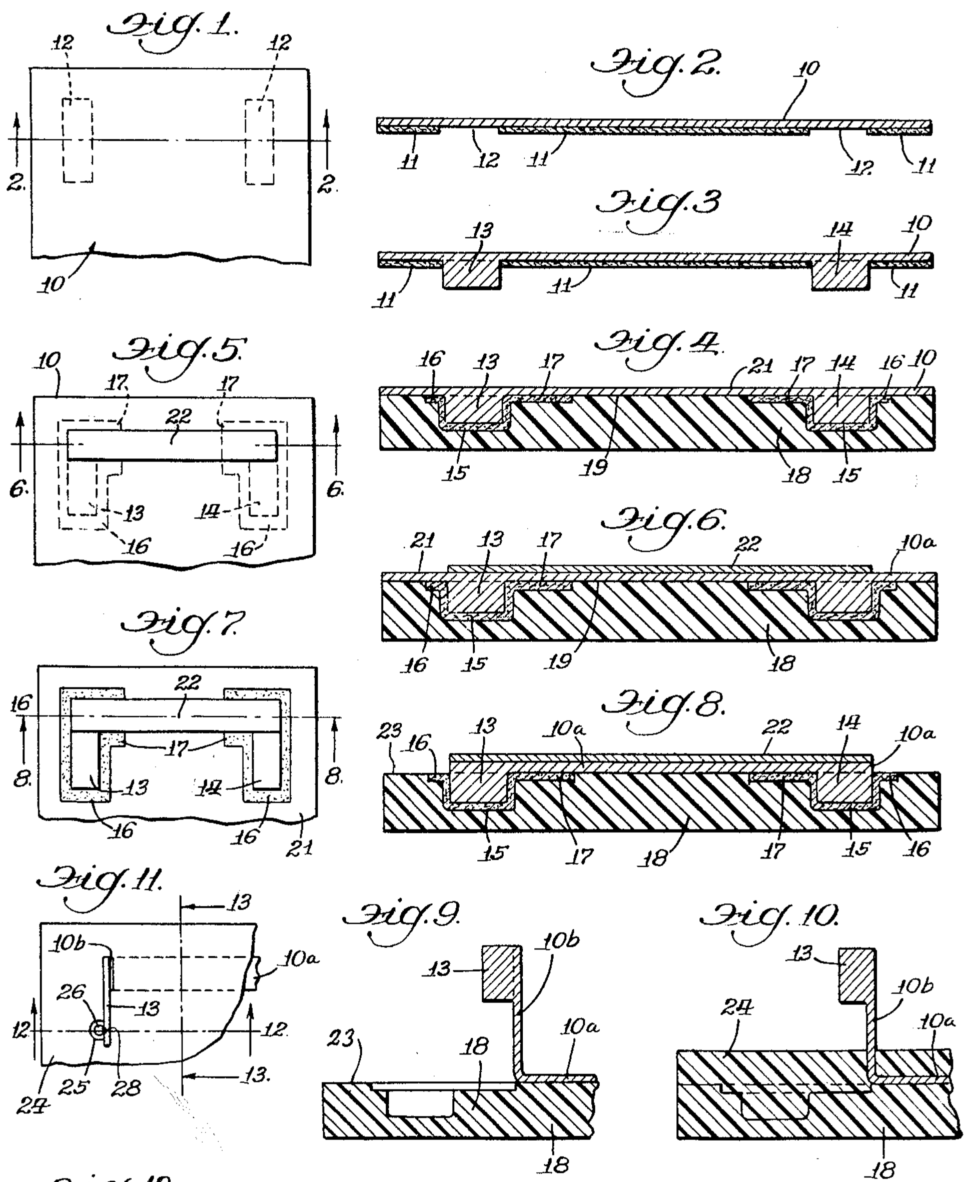
FIGURE 1 is a simplified diagrammatic plan view of a metallic backing sheet utilized in the manufacture of circuit boards according to the present concepts, showing the manner in which an undersurface thereof may be masked preparatory to the formation of terminal tabs as contemplated by the present teaching.
FIGURE 2 is a corresponding simplified cross-sectional view of the masked backing sheet shown in FIGURE 1, the view being taken substantially on the plane of the line 2—2 thereof.
FIGURES 3 and 4 illustrate subsequent steps in the preferred process of manufacturing circuit boards according to the present disclosure, by forming terminal tabs, applying release material to the terminal areas, and forming a dielectric insulating layer thereover.
FIGURE 5 is a fragmental plan view similar to FIGURE 1 and showing the backing sheet thereof after completion of the above steps and illustrating the manner in which the internal pattern conductors of the board are laid out on the face surface thereof by application of resist material.
FIGURE 6 is a cross-sectional view taken substantially on the plane of the line 6—6 of FIGURE 5.
FIGURE 7 is a plan view similar to FIGURE 5 showing the next subsequent step in the process.
FIGURE 8 is a cross-sectional view taken substantially on the plane of the line 8—8 of FIGURE 7.
FIGURE 9 is a fragmental cross-sectional view similar to FIGURE 8 illustrating the manner in which the terminal tabs of the circuit board conductors are lifted from the dielectric layer thereof in the process of manufacture.
FIGURE 10 is a cross-sectional view similar to FIGURE 9 and showing the tab area of the circuit board after the application of a second layer of dielectric material.
Figures 12, 13:
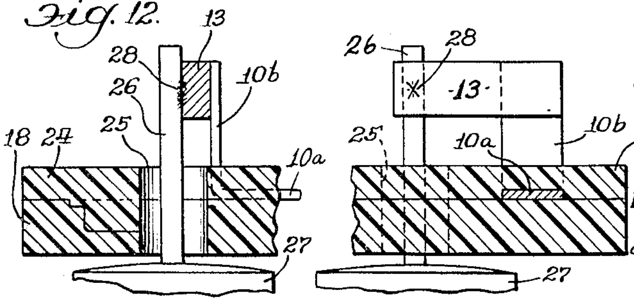

FIGURE 11 is a fragmental plan view of a portion of the completed circuit board showing the manner in which the upstanding tabs thereon may be joined to the leads from electronic components; and FIGURES 12 and 13 are cross-sectional views taken on the planes of the lines 12—12 and 13—13, respectively, of FIGURE 11.

According to the preferred practice of the present invention, the circuit boards of the construction disclosed in the drawings are developed by a series of electroplating and etching processes, together with application of successive layers of dielectric material which become the supporting sheet in which the pattern conductors of the circuit boards are carried.

The processes are preferably carried out by first applying a mask of photo-resist material 11 to one surface of a thin copper backing sheet 10. The "resist" covers the entire surface, except for bare spots or terminal areas corresponding to the points at which external connections to the conductors of the board will later be made, where blank surfaces 12 are left. These areas are then plated with relatively hard, tough, noncorrosive metal having the characteristics preferred for the terminals of the boards, until metallic terminals such as 13 and 14 are built up, each spaced from the others and each integrally bonded to the sheet 10. Nickel is the presently preferred material for these terminal layers, but it will be obvious to those skilled in the art that other metals may be used, if desired.

After the formation of the metallic terminal layers 13, 14, the resist coating 11 is removed, as shown in FIGURE 4, and the areas around the terminals 13, 14 are covered by a layer of release agent 15. The release agent 15 may be applied in liquid form or as a thin layer of adhesive masking tape, and, if desired, it may have a narrow margin edge 16 around the terminals. Also, if desired, this masked area may be extended in zones 17 underlying portions of the copper backing sheet near the terminals 13, 14 (FIGURE 5). The back of the sheet 10 is then covered with a dielectric layer 18 which adheres to the back face 19 of the plate 10 very firmly except at the terminal areas covered by the release masks 15.

The next step of manufacture is the formation of the circuit pattern on the upper face 21 of the backing sheet 10. This is illustrated in the simplified showing of FIGURE 5 wherein one or more strips of resist material 22 are applied to the face surface 21 of the sheet and extending between the several terminal areas represented by 13 and 14. These are, however on the front (upper) face of the backing sheet, opposite from terminals 13 and 14 (FIGURE 6). The sheet is subjected to an etching operation by which all of the exposed copper sheet 10 is dissolved, leaving only the interconnecting conductors *10a* underlying the resist masks 22, which may then be washed off if desired.

The etching of the copper exposes the upper face 23 of the layer 18 of dielectric insulation except for the conductors *10a* but, because of the release material 15, the terminal portions 13 and 14 adhere only very loosely to the dielectric layer 18, so that the terminals may be lifted and the end portions *10b* of the conductors *10a* bent upwardly, as shown in FIGURE 9, to form upstanding terminal brackets on the circuit board. The board may be used in the form shown in FIGURE 9, if desired, but it is generally of advantage to finish it by the application of another dielectric layer 24 as illustrated in FIGURE 10, and, if desired, by applying a flash plating of gold or other metal to the exposed brackets to prevent corrosion and facilitate soldering. Also, perforations 25 may be formed in the board to permit the axial leads 26 of electronic components 27 to be passed therethrough, for convenience in welding or soldering the leads to the terminals of the board in the manner illustrated at 28 in FIGURES 12 and 13.

From the above it will be apparent to those skilled in the art that, although the internal conductors of the boards here disclosed have an unusually high degree of electrical conductivity, they are suited to withstanding impact and vibration since they consist of thin, flexible ribbons, unlikely to be damaged by vibration or bending. Also, although the individual conductors of the boards each consist of a single integrated piece of metal, yet they each include terminal tabs suitable for soldering, yet formed of tough, hard metal, capable of forming welds of the highest quality, and fusible only at a higher temperature than any of the more ductile metals. The upstanding terminal brackets of the boards permit any bending of the conductors that may be required for the assembly of components thereon, yet the bending takes place in the ductile areas of the conductors, without need for bending of the harder metal of the terminal tabs.

The present invention thus provides a circuit board having the inherent advantages of high conductivity interconnected strips formed of copper or silver, yet the junctions may be welded between metals of more tough, durable characteristics. By this means the circuitry may be almost impervious to physical shock, impact or vibration, even when simultaneously subjected to temperatures which would destroy conventional equipment.

Having thus described the invention, what I claim as new and desire to protect by United States Letters Patent is:

1. The method of manufacturing electronic circuit boards consisting of the steps of applying a resistive mask to one face of a backing sheet consisting of relatively soft, ductile, high conductivity metal leaving plurality of blank terminal areas spaced apart from each other; forming terminal tabs of relatively hard metal integral with the aforesaid conductive sheet by plating the unmasked areas of the backing sheet; removing the aforesaid resistive mask; applying individual release masks to the aforesaid terminal tabs and the area of the backing sheet immediately surrounding said tabs; covering the backing sheet with a dielectric layer which adheres to the backing sheet; applying a resistive coating to the face of the backing sheet opposite the aforementioned tabs and masks with the resistive coating in accordance with the desired conductor pattern of the board and including at least on conductor extending between the plurality of the aforesaid terminal tabs; etching the unmasked portion of the conductive sheet away to leave at least one interconnecting conductor of ductile, high conductivity metal extending between a plurality of the aforesaid terminal tabs; and lifting the terminal layers from the dielectric sheet of the board by bending the ductile metal of the conductors adjacent the tabs.

2. The method of forming a weldable terminal in the manufacture of an electric circuit board including the steps of forming a terminal tab of metal suitable for welding by plating the metal to a terminal area formed by an opening in a mask that covers a backing sheet of electrically conductive, bendable metal; applying a release mask to the terminal tab; covering the backing sheet, including the release mask, with a dielectric layer; after the circuit pattern of the board has been established, lifting the terminal tab away from the dielectric layer by bending the electrically conductive material adjacent the tab.

References Cited by the Examiner

UNITED STATES PATENTS 2,587,568 2/52 Eisler.
3,098,951 7/63 Ayer et al.

OTHER REFERENCES

Electronic Products, "Welded Circuitry for Miniaturization" (D. A. Sayles), June 1961, pp. 8 and 9 relied upon.

JOHN F. CAMPBELL, *Primay Examiner.*